US005182462A

United States Patent [19]

Wright

[11] Patent Number: 5,182,462

[45] Date of Patent: Jan. 26, 1993

[54] CURRENT SOURCE WHOSE OUTPUT INCREASES AS CONTROL VOLTAGES ARE BALANCED

[75] Inventor: Michael E. Wright, Berkeley, Calif.

[73] Assignee: National Semiconductor Corp., Santa Clara, Calif.

[21] Appl. No.: 845,312

[22] Filed: Mar. 3, 1992

[51] Int. Cl.[5] .......................... B60T 17/18; H03K 5/01

[52] U.S. Cl. .................................. 307/43; 307/296.1; 307/299.3; 307/243; 307/529; 328/156; 328/158; 323/315

[58] Field of Search .................... 307/43, 296.1, 299.3, 307/243, 529; 323/315; 328/156, 158

[56] References Cited

U.S. PATENT DOCUMENTS

| | | | |
|---|---|---|---|
| 3,648,154 | 3/1972 | Frederiksen et al. | 323/22 T |
| 4,157,493 | 6/1979 | Monticelli | 323/9 |
| 4,214,176 | 7/1980 | Kushner | 307/297 |
| 4,543,522 | 9/1985 | Moreau | 323/303 |
| 4,613,809 | 9/1986 | Skovmand | 323/268 |
| 4,638,175 | 1/1987 | Bradford et al. | 307/64 |
| 4,642,551 | 2/1987 | Miller | 323/314 |
| 4,799,037 | 10/1988 | Locascio | 323/275 |
| 5,034,626 | 7/1991 | Pirez et al. | 323/315 |

*Primary Examiner*—William L. Sikes
*Assistant Examiner*—Margaret Rose Wambach
*Attorney, Agent, or Firm*—Steven F. Caserza

[57] ABSTRACT

A novel circuit is taught to provide a smooth current transfer function over a range of two input voltages, so that power can be supplied to an electronic circuit from more than a single power source. In one embodiment such power sources include a battery and an DC supply operated off the AC mains. Associated with each such supply is a current source designed to provide a reference current. This reference current is used to establish mirror currents from each of the power leads in order to provide the desired output current.

2 Claims, 2 Drawing Sheets

CURRENT SOURCE WHOSE OUTPUT INCREASES AS CONTROL VOLTAGES ARE BALANCED

INTRODUCTION

1. Field of the Invention

This invention relates to electronic circuits and more particularly to a current source for providing an output current which increases as control voltages are balanced.

2. Background

FIG. 1 is a schematic diagram of a typical prior art multiple emitter PNP transistor 100. Such a transistor may be used as a current control mechanism for powering electronic circuits connected to collector 101 in response to one or more voltage supplies connected to one or more emitters, two of which are shown in FIG. 1 as emitters 102-1 and 102-N. Base 104 of transistor 100 is typically connected to ground, for examples through control circuitry (not shown detail ij base drive circuit 107).

One example of a typical use of transistor 100 of FIG. 1 is to power a personal computer, or any electronic device operating from either an external DC supply, rectified AC from power lines or a battery source. For example, with a rectified AC power supply voltage Vl applied to emitter 102-1 and a battery supply voltage VN applied to emitter 102-N, a current IP is sourced by collector 101, as controlled by base 104, in such a way as to produce a regulated voltage at collector 101. When there is a difference between voltage Vl and VN on the order of the thermal voltage kt/q (26mV at 27° C.) or greater, a minimum amount of current Imin is sourced by collector 101. Conversely, when the difference between voltages Vl and VN is less than the thermal voltage, for example when a user of transistor 100 desires to connect emitters 102-1 through 102-N in common, a current $I_{max}$ greater than IP is sourced by collector 101. Current limiting of collector current 101 may be desired to protect transistor 100 or the load. Rather than using voltage drops on resistors in series with terminals 101 or 102-1 through 102-N, with inherent circuit complexity, current limit function can be achieved by current limiting the base 104 current, since transistor 100 current gain is relatively well known when using transistor 100 at high current density, or by taking a small collector segment 105 to the base terminal.

FIG. 1 is a schematic diagram of a generalized voltage regulator circuit that operates using power connections from one or more input power supply voltages. If transistor 100 conduction control circuit "base drive" 107 is so configured, transistor 100 collector 101 node is a regulated voltage as long as one or more emitters 102-1 through 102-N have an adequate power supply voltage applied via voltages Vl through VN. The minimum acceptable voltage on at least one of Vl through VN is a transistor saturation voltage, Vsat, above the desired output regulation voltage, 5.1V input for a 5V regulated output, for example. The standard technique of using a resistor in series with either the emitter leads 102-1 through 102-N, or in series with collector 101 is undesirable. The current limit function could be produced by putting a current limit on base drive 100, if the current gain of transistor 100 is adequately well known. In the case of transistor 100 being a lateral PNP, the current gain at high current density can be adequately well known. The current gain of transistor 100 may be made better known by adding feedback collector 105 to fix the current gain as the ratio of the conductions of collectors 101 and 105. Note that this feedback can also be applied when the PNP transistor 100 is replaced with an insulated gate device such as a MOSFET.

It is often desired to provide a means for increasing the base current through base 104 of transistor 100 when a plurality of emitters 102-1 through 102-N are conducting, because transistor 100 can control more power with a plurality emitters conducting than with just one emitter conducting.

The material current source with an output current which increases as a plurality of control voltages become balanced, was developed as a means for increasing the base current through base 104, FIG. 1, within this problem in a specialized voltage regulator function, as well as a solution to the more general problems associated with electronic circuit operation from a plurality of more power supplies. The teaching set out by Jim LaCascio in U.S. Pat. No. 4,779,037 relates to a low Vin-Vout voltage regulator that produces a regulated output voltage when either of two power sources has power available (a supplied DC voltage normally from the car battery and energy stored in a capacitor nominally). The subject matter and teaching in U.S. Pat. application "Common Emitter Amplifiers Operating From A Multiplicity of Power Supoplies," by this inventor relates to the more general techniques used to power circuits from two or more power supplies. The teaching of U.S. Pat. No. 4,779,037, and the patent application of this inventor is incorporated herein by reference.

SUMMARY OF THE INVENTION

A novel circuit is taught to provide a continuous current transfer function over a range of a plurality of input voltages, so that power can be supplied to an electronic circuit from more than a single power source. In one embodiment of this invention, such power sources include a battery and an DC supply operated off the AC mains. Associated with each such supply is a current source designed to provide a reference current. This reference current is used to establish mirror currents from each of the power leads in order to provide the desired output current. A further improvement is to understand that a transistor can handle more current when more power supplies Vl through VN are wired in parallel, as in the case of the user having fewer different power supplies then there are separate emitters built into any specific implementation of the transistor. The current limit may be increased when any two or more power supply voltages Vl through VN are balanced. The circuit of the invention is used to implement the increased current limit when supply voltage pairs approach balance. It is to be understood that the circuit of the invention has uses much broader than the use of the example current limit, and is offered simply as one example.

Detailed Description

Figure 3:
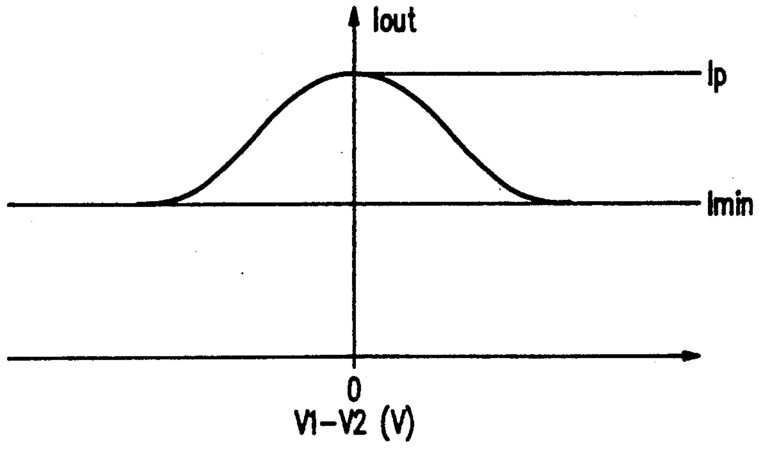
FIG. 3 is a graph depicting an example of a desired transfer function capable of being generated in accordance with the teachings of this invention.

It is desired to provide a smooth and continuous current transfer function over a range of voltages (Vl and V2), as is depicted in the graph of FIG. 3, which shows one example of a current transfer function capable of being generated in accordance with the teachings of this invention. The current transfer function shown in FIG. 3 shows that IP is approximately equal to 2 Imin, and the width of the bell shaped curve of the transfer function is proportional to the effective saturation current of a transistor pair operating from the same control voltage pair. Naturally, other current magnitudes IP, and shapes of the transfer function are possible in accordance with the teachings of this invention.

Figure 1:
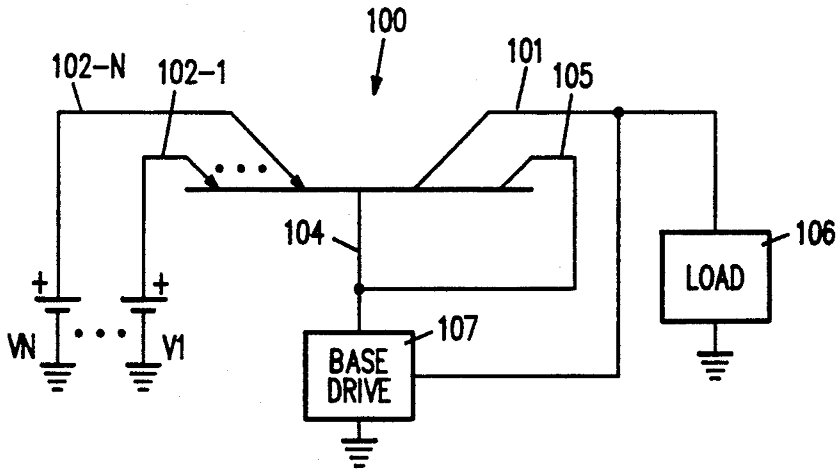
FIG. 1 is a schematic diagram of a typical prior art multiple emitter PNP transistor suitable for use as a current control mechanism.
Figure 4:
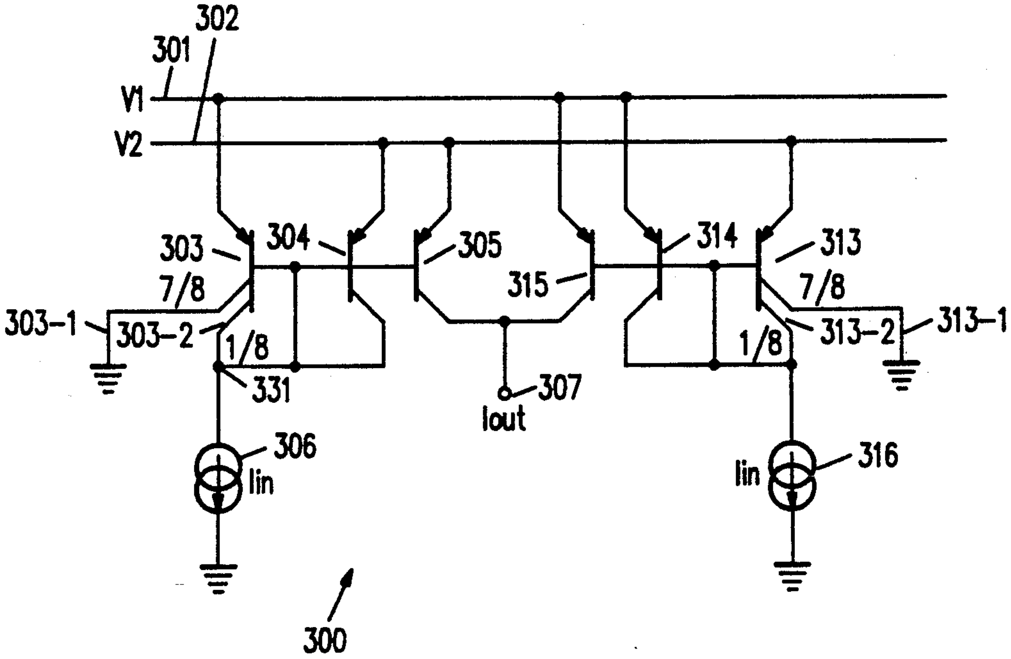
FIG. 4 is a schematic diagram of one embodiment of a circuit constructed in accordance with the teachings of this invention.

FIG. 4 is a schematic diagram of one embodiment of a circuit 300 constructed in accordance with the teachings of this invention for providing a transfer curve as shown in FIG. 4 and for providing an appropriate control signal to base 104 of a transistor as depicted in FIG. 1. Input voltage Vl is applied to voltage bus 301, and input voltage V2 is applied to voltage bus 302. In response to a positive voltage Vl, transistor 303 conducts current through collector 303-1 to ground. A proportional amount of current is conducted through collector 303-2 to current source 306. Transistor 304 is connected to mirror the current through collector 303-2, and transistor 305 is in turn connected to mirror the current through transistor 304 to output terminal 307. In a similar fashion, in response to a positive voltage V2, transistor 313 conducts current through collector 313-1 to ground. A proportional amount of current is conducted through collector 313-2 to current source 316. Transistor 314 is connected to mirror the current through the collector 313-2, and transistor 315 is in turn connected to mirror the current through transistor 314 to output terminal 307.

In a preferred embodiment, the saturation currents of transistors 303, 304, 305, 313, 314 and 315 are equal and all emitters of these transistors are fabricated to the same size for easy construction. When this is the case, the ratio of output current Iout to Iin (the currents provided by current sources 306 and 316) must be one of the several discrete values.

Output current Iout may be expressed as follows:

$$IP = Iout_{(max)} = 2\, Iin \frac{(N)}{(N+1)} \text{; where} \qquad (1)$$

Iin = the current provided by each of current sources 306 and 316; and

N = the ratio of the conduction of the collector of transistor 304 to collector 303-2.

In the embodiment shown in FIG. 4, N equals 8, and thus $$IP = 2\, Iin \frac{(8)}{(9)} \qquad (2)$$

-continued $$\sim 1.78\, Iin \qquad (3)$$

Referring again to Equation 1, as N increases, and the area of collector 303-2 (and thus of collector 313-2) decreases, IP increases to 2 Iin.

In alternative embodiments, transistor saturation currents are varied to any desired value by adjusting emitter areas accordingly.

Figure 5:
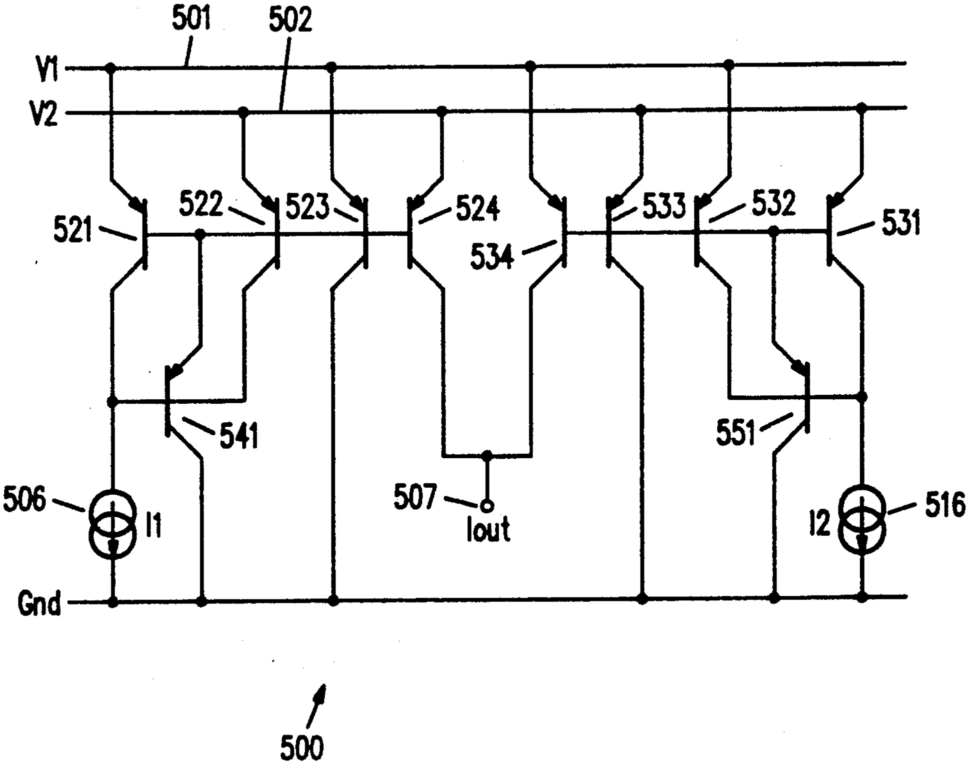
FIG. 5 is a schematic diagram of an alternative embodiment of this invention.

FIG. 5 is a schematic diagram of another embodiment of a circuit constructed in accordance with the teachings of this invention. Circuit 500 of FIG. 5 is similar to circuit 300 of FIG. 3 with the exception that, in FIG. 5, transistors 521 and serve the same function as transistor 303 of FIG. 4. Likewise, in FIG. 5 transistors 531 and serve the same function as transistor 313 of FIG. 4. In circuit 500, transistor 522 serves the same function as transistor 304 of circuit 300 and transistor 532 serves the same function as transistor 314. Circuit 500 of FIG. 5 includes transistors 541 and 551 to remove the base current of transistors 521, 522, 523, 524, and transistors 531, 532, 533, and 534, respectively, in the well known superdiode configuration.

The value N of circuits 300 or 500 may be set by transistor conduction ratios in circuit 300, and emitter conduction ratios in circuit 500. If the conduction ratio of transistors 303-2 and 304 of circuit 300 is decreased to N=2 by building transistor 303-2 as a half area collector, the conduction ratio of transistors 313-2 and 314 may be left at N=8. In this way, the transfer function of the circuit, as shown in FIG. 3, may be made asymmetrical. This is important if circuit 100 of FIG. 1 contains a power transistor whose emitter 102-1 was smaller than emitter 102-N.

Figure 2:
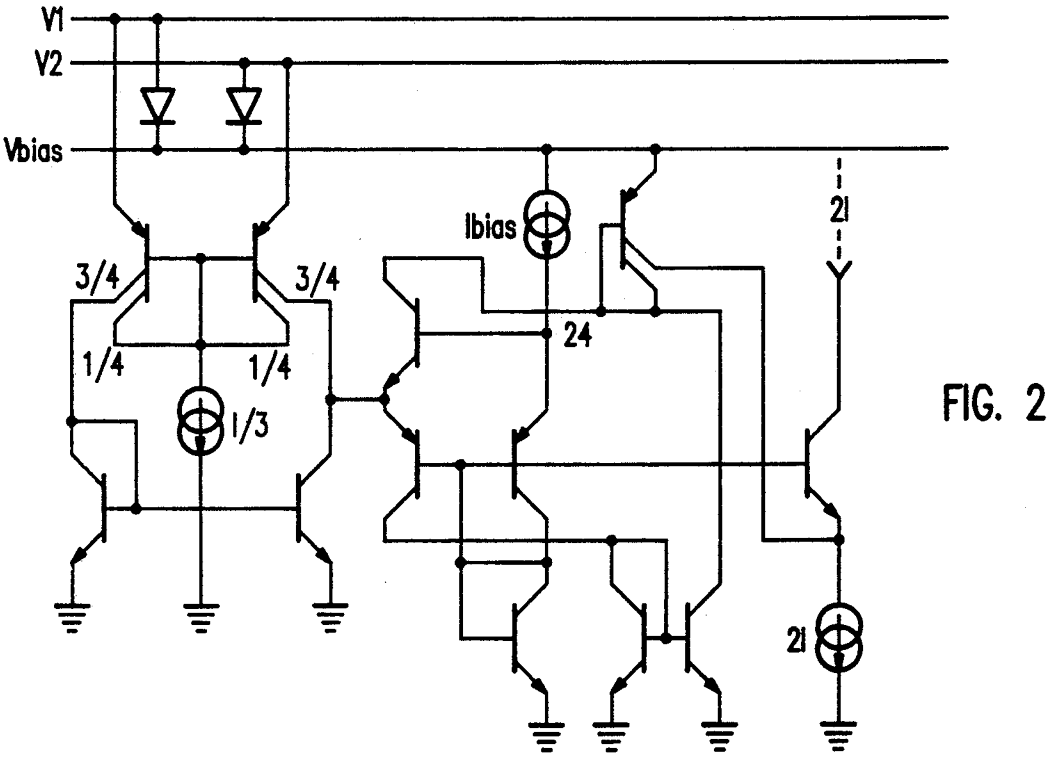
FIG. 2 is a schematic diagram of one embodiment of this invention suitable for providing an output current from one or more of a plurality of input supplies.

FIG. 2 is a schematic representation of a circuit in accordance with this invention whose output current increases as control voltages as V1 and Vn are balanced as long as the absolute value of V1 or VN is above a transistor VBE+VSAT of about 1V and Vbias is adequate.

It will be readily appreciated by those of ordinary skill in the art in light of the teachings of this invention, that circuits constructed in accordance with the teachings of this invention may be utilized with three or more voltage sources. In this event, a circuit as described suitable for use with two supply voltages is required to be used with each combination of two supply voltages. Thus, as shown in FIGS. 4 and 5, a single circuit is suitable for use with two voltage supplies. If three voltage supplies are required, two such circuits are required. If four voltages supplies are utilized, a total of six such circuits are used, one for each permutation of two voltage supplies.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A circuit comprising:

a first power input lead of a first polarity;

a second power input lead of said first polarity;

a third power input lead of a second polarity;

an output lead for providing an output current;

a first current mirror circuit comprising:

a first transistor having a first current handling lead coupled to said first power supply lead, a second current handling lead coupled to said third power supply lead, a third current handling lead coupled to said third power supply lead, and a control lead coupled to said third current handling lead;

a second transistor having a first current handling lead coupled to said second power supply lead, a second current handling lead coupled to said control lead of said first transistor, and a control lead coupled to said control lead of said first transistor; and a third transistor having a first current handling lead coupled to said second power supply lead, a second current handling lead coupled to said output lead, and a control lead coupled to said control lead of said first transistor; and a second current mirror circuit comprising:

a fourth transistor having a first current handling lead coupled to said second power supply lead, a second current handling lead coupled to said third power supply lead, a third current handling lead coupled to said third power supply lead, and a control lead coupled to said third current handling lead;

a fifth transistor having a first current handling lead coupled to said first power supply lead, a second current handling lead coupled to said control lead of said first transistor, and a control lead coupled to said control lead of said fourth transistor; and a sixth transistor having a first current handling lead coupled to said first power supply lead, a second current handling lead coupled to said output lead, and a control lead coupled to said control lead of said fourth transistor.

2. A circuit comprising:

a first power input lead of a first polarity;

a second power input lead of said first polarity;

a third power input lead of a second polarity;

an output lead for providing an output current;

a first current mirror circuit comprising:

a first means for establishing a first current flow from said first power supply lead to said third power supply lead, having a control lead having a control voltage associated with said first current;

means for mirroring current from said first power supply lead to said third power supply lead, having a control lead coupled to said control lead of said first means;

means for mirroring current from said second power supply lead to said third power supply lead, having a control lead coupled to said control lead of said first means; and means for mirroring current from said second power supply lead to said output terminal, having a control lead coupled to said control lead of said first means; and a second current mirror means comprising:

a second means for establishing a second current flow from said second power supply lead to said third power supply lead, having a control lead having a control voltage associated with said second current;

means for mirroring current from said first power supply lead to said third power supply lead, having a control lead coupled to said control lead of said second means;

means for mirroring current from said second power supply lead to said third power supply lead, having a control lead coupled to said control lead of said second means; and means for mirroring current from said first power supply lead to said output terminal, having a control lead coupled to said control lead of said second means.

* * * * *